US011430659B2

(12) United States Patent
Noda et al.

(10) Patent No.: US 11,430,659 B2
(45) Date of Patent: Aug. 30, 2022

(54) LIGHT-EMITTING DEVICE, METHOD FOR MANUFACTURING THE SAME, AND PROJECTOR

(71) Applicants: Seiko Epson Corporation, Tokyo (JP); Sophia School Corporation, Tokyo (JP)

(72) Inventors: Takafumi Noda, Matsumoto (JP); Katsumi Kishino, Akiruno (JP)

(73) Assignees: Seiko Epson Corporation; Sophia School Corporation

( * ) Notice: Subject to any disclaimer, the term of this patent is extended or adjusted under 35 U.S.C. 154(b) by 43 days.

(21) Appl. No.: 16/640,780

(22) PCT Filed: Aug. 3, 2018

(86) PCT No.: PCT/JP2018/029268
§ 371 (c)(1),
(2) Date: Feb. 21, 2020

(87) PCT Pub. No.: WO2019/039238
PCT Pub. Date: Feb. 28, 2019

(65) Prior Publication Data

US 2021/0043457 A1 Feb. 11, 2021

(30) Foreign Application Priority Data

Aug. 24, 2017 (JP) ............................ JP2017-161426

(51) Int. Cl.
*H01L 21/203* (2006.01)
*H01L 33/62* (2010.01)
*H01S 5/12* (2021.01)

(52) U.S. Cl.
CPC ............ *H01L 21/203* (2013.01); *H01L 33/62* (2013.01); *H01S 5/12* (2013.01)

(58) Field of Classification Search
None
See application file for complete search history.

(56) References Cited

U.S. PATENT DOCUMENTS 8,785,905 B1 * 7/2014 Wang ...................... H01L 33/24 257/13
2002/0117677 A1 * 8/2002 Okuyama .............. H01L 33/24 257/94
(Continued)

FOREIGN PATENT DOCUMENTS

JP 2005-277374 A 10/2005
JP 2007-049062 A 2/2007
(Continued)

*Primary Examiner* — Khaja Ahmad
(74) *Attorney, Agent, or Firm* — Harness, Dickey & Pierce, P.L.C.

(57) ABSTRACT

A light-emitting device includes: a substrate; and a laminated structure provided at the substrate and having a plurality of columnar parts. The columnar part has: an n-type first semiconductor layer; a p-type second semiconductor layer; a light-emitting layer provided between the first semiconductor layer and the second semiconductor layer; and an electrode provided on a side opposite to a side of the substrate, of the laminated structure. The first semiconductor layer is provided between the light-emitting layer and the substrate. An end part on a side opposite to a side of the substrate, of the light-emitting layer, has a first facet surface. An end part on a side opposite to a side of the substrate, of the second semiconductor layer, has a second facet surface. A relation of $\theta 2 \leq \theta 1$ is satisfied, where $\theta 1$ is a taper angle of the first facet surface, and $\theta 2$ is a taper angle of the second facet surface. $\theta 1$ is 70° or smaller, and $\theta 2$ is 30° or greater.

6 Claims, 6 Drawing Sheets

(56) References Cited

U.S. PATENT DOCUMENTS

2005/0277218 A1 12/2005 Nakajo et al.
2008/0191191 A1 8/2008 Kim
2011/0127539 A1 6/2011 Komada
2013/0313514 A1* 11/2013 Hwang .................. H01L 33/16
977/762
2017/0323925 A1* 11/2017 Schneider, Jr. ....... H01L 27/156
2019/0214529 A1* 7/2019 Ahmed .................. H01L 33/06
2021/0043457 A1* 2/2021 Noda ..................... H01L 33/62

FOREIGN PATENT DOCUMENTS

JP 2008-544567 A 12/2008
JP 2009-076896 A 4/2009
JP 2011-119333 A 6/2011

* cited by examiner

FIG. 9
FIG. 10
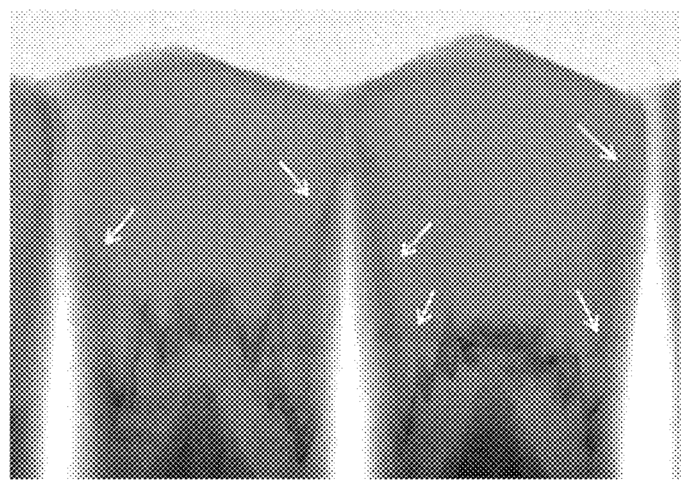
FIG. 11
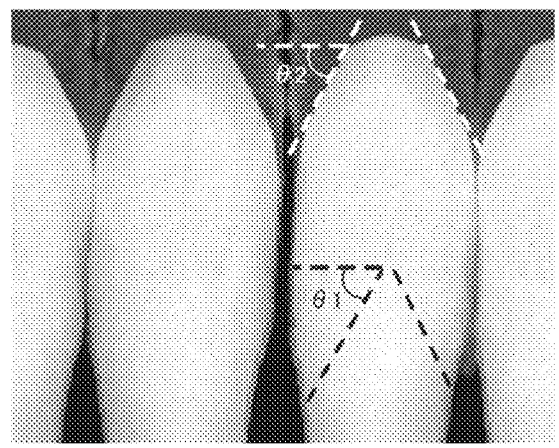

LIGHT-EMITTING DEVICE, METHOD FOR MANUFACTURING THE SAME, AND PROJECTOR

The present application is based on, and claims priority from JP Application Serial Number 2017-161426, filed on Aug. 24, 2017, the disclosure of which is hereby incorporated by reference herein in its entirety.

TECHNICAL FIELD

The present disclosure relates to a light-emitting device, a method for manufacturing the same, and a projector.

RELATED ART

A semiconductor light-emitting device such as a semiconductor laser or LED (light-emitting diode) uses a GaN-based, GaAs-based or similar material (see, for example, JP-A-2007-49062).

For example, confining light in an active layer of a semiconductor laser is an important factor that largely influences the performance of an element such as threshold current density. Increasing the difference in refractive index between the active layer and the cladding layer can increase the optical confinement factor.

However, in the light-emitting device as described above, since conditions such as lattice matching need to be considered based on the material of the active layer and the material of the substrate, material choices are greatly limited. Therefore, it is difficult to secure a difference in refractive index between the active layer and the cladding layer and to increase the optical confinement factor. When the optical confinement factor cannot be increased, for example, light generated in the active layer leaks out toward an electrode and is absorbed by the electrode, thus resulting in a loss.

SUMMARY

An object of some aspects of the disclosure is to provide a light-emitting device in which absorption of light by an electrode can be reduced. Alternatively, an object of some aspects of the disclosure is to provide a method for manufacturing a light-emitting device in which absorption of light by an electrode can be reduced. Alternatively, an object of some aspects of the disclosure is to provide a projector having the foregoing light-emitting device.

A light-emitting device according to the disclosure includes:

a substrate; and a laminated structure provided at the substrate and having a plurality of columnar parts.

The columnar part has:

an n-type first semiconductor layer;

a p-type second semiconductor layer;

a light-emitting layer provided between the first semiconductor layer and the second semiconductor layer; and an electrode provided on a side opposite to a side of the substrate, of the laminated structure.

The first semiconductor layer is provided between the light-emitting layer and the substrate.

An end part on aside opposite to aside of the substrate, of the light-emitting layer, has a first facet surface.

An end part on aside opposite to aside of the substrate, of the second semiconductor layer, has a second facet surface.

A relation of $\theta 2 \leq \theta 1$ is satisfied, where $\theta 1$ is a taper angle of the first facet surface, and $\theta 2$ is a taper angle of the second facet surface.

The $\theta 1$ is 70° or smaller.

The $\theta 2$ is 30° or greater.

In such a light-emitting device, the difference between an average refractive index in a planar direction at the part where the second facet surface is provided, and an average refractive index in a planar direction at the part where the light-emitting layer is provided, can be increased. Therefore, in such a light-emitting device, the light generated in the light-emitting layer can be restrained from leaking out toward the electrode and therefore the absorption of the light by the electrode can be reduced.

In the light-emitting device according to the disclosure, the first semiconductor layer may contain gallium nitride, the second semiconductor layer may contain indium gallium nitride, the light-emitting layer may contain indium gallium nitride, and relations of $0<x<1$ and $x<y$ may be satisfied, where a composition of indium gallium nitride of the second semiconductor layer is $In_xGa_{1-x}N$ and a composition of indium gallium nitride of the light-emitting layer is $In_yGa_{1-y}N$.

In such a light-emitting device, the difference in lattice constant between the light-emitting layer and the second semiconductor layer can be reduced. Thus, in such a light-emitting device, a strain generated in the light-emitting layer due to the difference in lattice constant between the light-emitting layer and the second semiconductor layer can be alleviated and crystal defects generated by the strain can be reduced. Thus, such a light-emitting device can have a high light emission efficiency.

In the light-emitting device according to the disclosure, a relation of $x<0.5$ may be satisfied.

In such a light-emitting device, the difference in lattice constant between the light-emitting layer and the second semiconductor layer can be reduced.

In the light-emitting device according to the disclosure, the x at an end part on the side of the substrate, of the second semiconductor layer, may be larger than the x at the end part on the side opposite to the side of the substrate, of the second semiconductor layer.

In such a light-emitting device, x of the second semiconductor layer is increased at the end part on the side of the substrate, of the second semiconductor layer, which tends to influence the light-emitting layer. Thus, the strain generated in the light-emitting layer can be alleviated.

In the light-emitting device according to the disclosure, the x at the end part on the side of the substrate, of the second semiconductor layer, may be 0.01 or less.

In such a light-emitting device, the difference in lattice constant between the light-emitting layer and the second semiconductor layer can be reduced.

In the light-emitting device according to the disclosure, the second facet surface may have a part covered with the electrode, and a part not covered with the electrode.

In such a light-emitting device, compared with the case where the electrode covers the entirety of the facet surface, the light generated in the light-emitting layer can be restrained from leaking out toward the electrode and the absorption of the light by the electrode can be reduced.

A method for manufacturing a light-emitting device according to the disclosure includes:

a step of forming a plurality of columnar parts at a substrate; and a step of forming an electrode on a side opposite to a side of the substrate, of the columnar part.

The step of forming the columnar part includes:

a step of supplying gallium and nitrogen, and causing crystal growth of an n-type first semiconductor layer;

a step of supplying indium, gallium, and nitrogen, and causing crystal growth of a light-emitting layer at the first semiconductor layer; and a step of supplying indium, gallium, and nitrogen, and causing crystal growth of a p-type second semiconductor layer at the light-emitting layer.

A formation temperature of the second semiconductor layer is higher than a formation temperature of the light-emitting layer.

In the step of causing crystal growth of the second semiconductor layer, irradiation with indium is performed to supply indium, and an amount of irradiation with indium is $1\times10^{-5}$ Pa or more and $2.5\times10^{-4}$ Pa or less.

Such a method for manufacturing a light-emitting device can manufacture a light-emitting deice in which absorption of light by the electrode can be reduced. Also, since the second semiconductor layer is formed with indium irradiation, a surfactant effect (interface effect due to addition of impurity) enables growth of crystal of good quality while terminating defects such as dislocation.

Such a method for manufacturing a light-emitting device can manufacture a light-emitting device having a high light emission efficiency (for details, see "Experiment Example" described later).

A projector according to the disclosure includes the light-emitting device according to the disclosure.

Such a projector can have the light-emitting device according to the disclosure.

BRIEF DESCRIPTION OF THE DRAWINGS

FIG. 9 is a TEM bright field image of a vicinity of a second semiconductor layer in Example 1.

FIG. 10 is a TEM bright field image of a vicinity of a second semiconductor layer in Comparative Example 1.

FIG. 11 is a TEM dark field image of a vicinity of the second semiconductor layer in Example 1.

DESCRIPTION OF EXEMPLARY EMBODIMENTS

A preferred embodiment of the disclosure will now be described in detail, using the drawings. The embodiment described below does not unduly limit the content of the disclosure described in the claims. Also, not all the configurations described below are necessarily essential elements of the disclosure.

1. Light-Emitting Device

Figure 1:
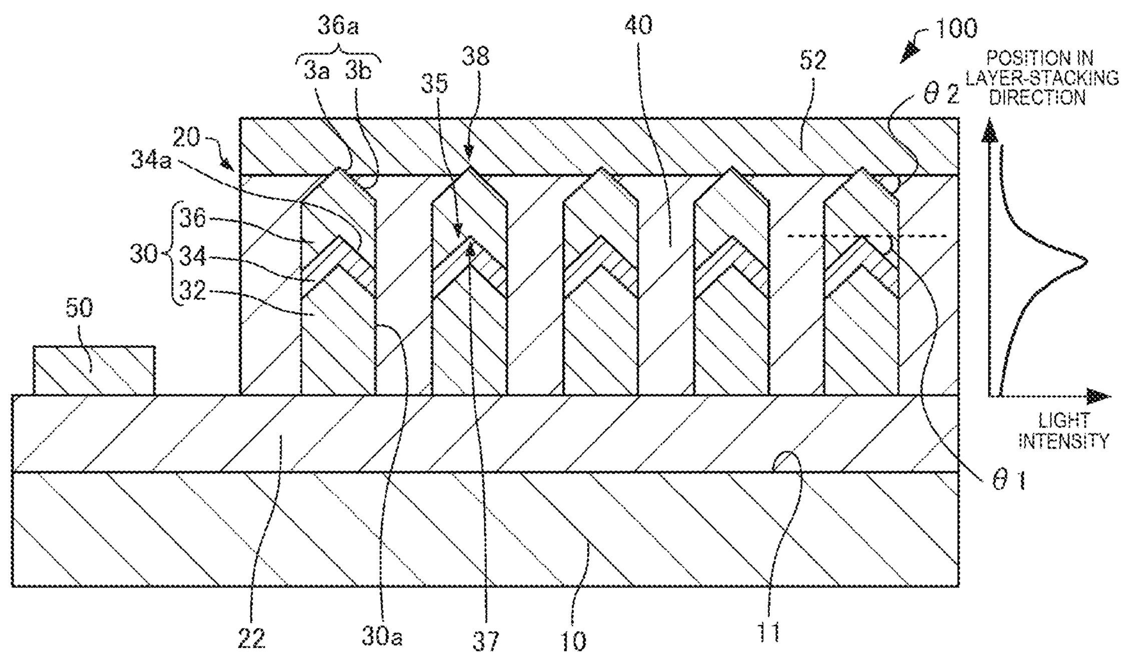
FIG. 1 is a cross-sectional view schematically showing a light-emitting device according to an embodiment.

First, a light-emitting device according to this embodiment will be described with reference to the drawings. FIG. 1 is a cross-sectional view schematically showing a light-emitting device 100 according to this embodiment.

The light-emitting device 100 has a substrate 10, a laminated structure 20, a first electrode 50, and a second electrode 52, as shown in FIG. 1.

The substrate 10 has, for example, plate-like shape. The substrate 10 is, for example, a Si substrate, GaN substrate, sapphire substrate or the like.

The laminated structure 20 is provided at the substrate 10 (over the substrate 10). The laminated structure 20 has a buffer layer 22, a columnar part 30, and a light propagation layer 40.

In this disclosure, "over" refers to a direction away from the substrate 10 as viewed from a light-emitting layer 34 of the columnar part 30, along a layer-stacking direction in the laminated structure 20 (hereinafter also referred to simply as a "layer-stacking direction"), and "under" refers to a direction toward the substrate 10 as viewed from the light-emitting layer 34, along the layer-stacking direction.

Also, in this disclosure, the "layer-stacking direction in the laminated structure 20" refers to the layer-stacking direction of a first semiconductor layer 32 and the light-emitting layer 34 of the columnar part 30 (in the illustrated example, up-down direction).

The buffer layer 22 is provided over the substrate 10. The buffer layer 22 is, for example, an n-type GaN layer (specifically, an n-type GaN layer doped with Si) or the like.

The columnar part 30 is provided over the buffer layer 22. The planar shape (shape as viewed from the layer-stacking direction) of the columnar part 30 is, for example, a polygon such as a hexagon, or a circle or the like. The diameter of the columnar part 30 is, for example, in the order of nm and specifically 10 nm or larger and 500 nm or smaller. The columnar part 30 is also called, for example, nanocolumn, nanowire, nanorod, or nanopillar. The size in the layer-stacking direction of the columnar part 30 is, for example, 0.1 μm or larger and 5 μm or smaller.

In this disclosure, when the planar shape of the columnar part 30 is a circle, the "diameter" is the diameter of the circle. When the planar shape of the columnar part 30 is a polygon, the "diameter" is the diameter of a smallest circle enclosing this polygon (smallest enclosing circle).

The columnar part 30 is provided in a plural number. The plurality of columnar parts 30 are spaced apart from each other. The space between the neighboring columnar parts 30 is, for example, 1 nm or larger and 500 nm or smaller. The plurality of columnar parts 30 are arrayed at a predetermined pitch in a predetermined direction as viewed in a plan view (as viewed from the layer-stacking direction). The plurality of columnar parts 30 are arranged, for example, in the shape of a triangular lattice, square lattice or the like. The plurality of columnar parts 30 can manifest a photonic crystal effect.

The columnar part 30 has the first semiconductor layer 32, the light-emitting layer 34, and a second semiconductor layer 36.

The first semiconductor layer 32 is provided over the buffer layer 22. The first semiconductor layer 32 is provided between the light-emitting layer 34 and the substrate 10. The first semiconductor layer 32 is, for example, an n-type semiconductor layer containing gallium nitride (GaN). The first semiconductor layer 32 is, for example, an n-type GaN layer doped with Si.

The light-emitting layer 34 is provided over the first semiconductor layer 32. The light-emitting layer 34 is provided between the first semiconductor layer 32 and the second semiconductor layer 36. The light-emitting layer 34 contains, for example, indium gallium nitride (InGaN). The light-emitting layer 34 has, for example, a quantum well structure made up of a GaN layer and an InGaN layer. The number of the GaN layers and InGaN layers forming the light-emitting layer 34 is not particularly limited. The light-emitting layer 34 is a layer that can emit light by having a current injected therein.

FIG. 1 schematically shows the light intensity at a position in the layer-stacking direction, of the light-emitting device 100. In the illustrated example, a light intensity peak (peak where the light intensity is at its maximum) is located in the light-emitting layer 34.

Figure 2:
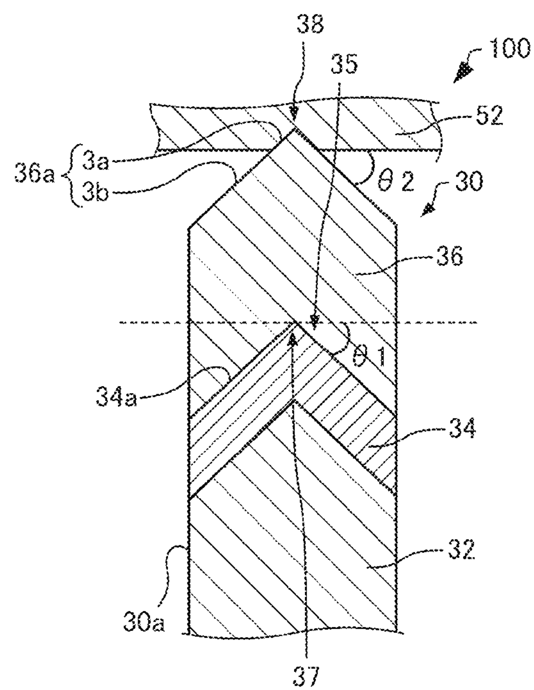
FIG. 2 is a cross-sectional view schematically showing the light-emitting device according to the embodiment.

The light-emitting layer 34 has a first facet surface 34*a* at an end part (upper end part) 35 on the side opposite to the side of the substrate 10. A facet surface refers to a surface formed by facet growth. In the illustrated example, the first facet surface 34*a* is in contact with the second semiconductor layer 36. The first facet surface 34*a* is a surface of the GaN layer or the InGaN layer forming the light-emitting layer 34. The first facet surface 34*a* is tilted at a taper angle θ1 in relation to an upper surface 11 of the substrate 10, that is, a surface orthogonal to the layer-stacking direction, as shown in FIG. 2. The taper angle θ1 is, for example, 30° or greater and 70° or smaller. The first facet surface 34*a* may be, for example, an r-plane. In this case, an ideal taper angle θ1 is 61°. FIG. 2 is an enlarged view of the columnar part 30 and the second electrode 52.

The second semiconductor layer 36 is provided over the light-emitting layer 34. The second semiconductor layer 36 is a p-type semiconductor layer. The second semiconductor layer 36 may include an InGaN layer. The second semiconductor layer 36 is, for example, a p-type GaN layer and InGaN layer doped with Mg. The semiconductor layers 32, 36 are cladding layers having the function of confining light in the light-emitting layer 34 (restraining light from leaking out of the light-emitting layer 34).

When the second semiconductor layer 36 includes an InGaN layer and where the composition of indium gallium nitride of the second semiconductor layer 36 is $In_xGa_{1-x}N$ and the composition of indium gallium nitride of the light-emitting layer 34 is $In_yGa_{1-y}N$, x and y satisfy the relations of the following formulas (1) and (2). Also, x satisfies, for example, the relation of the following formula (3).

$$0<x<1 \quad (1)$$

$$x<y \quad (2)$$

$$x<0.5 \quad (3)$$

The second semiconductor layer 36 has an end part (lower end part) 37 on the side of the light-emitting layer 34 (on the side of the substrate 10), and an end part (upper end part) 38 on the side (the side of the second electrode 52) opposite to the side of the light-emitting layer 34 (on the side of the substrate 10). X (In composition ratio x) at the lower end part 37 is higher than the In composition ratio x at the upper end part 38. The In composition ratio x at the lower end part 37 is, for example, 0.01 or lower. In the second semiconductor layer 36, the In composition ratio x may decrease as it goes from the side of the light-emitting layer 34 to the side of the second electrode 52.

The lower end part 37 of the second semiconductor layer 36 is a part within a distance of 100 nm or shorter from the light-emitting layer 34. The upper end part 38 of the second semiconductor layer 36 is a part within a distance of 100 nm or shorter from the surface on the side opposite to the side of the light-emitting layer 34 of the second semiconductor layer 36 (in the illustrated example, a second facet surface 36*a*).

Also, when the In composition ratio x at the lower end part 37 of the second semiconductor layer 36 satisfies the formulas (1) and (2), the other parts than the lower end part 37 of the second semiconductor layer 36 (for example, the upper end part 38) need not contain In. The second semiconductor layer 36 may have a contact layer forming an interface with the second electrode 52 and in ohmic contact with the second electrode 52. In this case, the contact layer need not contain In.

The upper end part 38 of the second semiconductor layer 36 has a second facet surface 36*a*. In the illustrated example, the second facet surface 36*a* is in contact with the second semiconductor layer 36. The second facet surface 36*a* is tilted at a taper angle θ2 in relation to the upper surface 11 of the substrate 10, that is, a surface orthogonal to the layer-stacking direction. The taper angle θ1 and the taper angle θ2 satisfy the relation of θ2≤θ1. The taper angle θ2 is, for example, 30° or greater and 61° or smaller. The second facet surface 36*a* may be, for example, an r-plane. In this case, an ideal taper angle θ2 is 61°. Although not illustrated in the drawings, the upper end part 38 may also have a surface that is not a facet surface, provided that the upper end part 38 has the second facet surface 36*a*.

The second facet surface 36*a* of the second semiconductor layer 36 is coupled to a lateral surface (in the illustrated example, a surface having a normal line extending in a direction orthogonal to the layer-stacking direction) 30*a* of the columnar part 30. The second facet surface 36*a* has a first part 3*a* covered with the second electrode 52 and a second part 3*b* not covered with the second electrode 52.

The light propagation layer 40 is provided between the neighboring columnar parts 30. The light propagation layer 40 is provided over the buffer layer 22. In the illustrated example, the light propagation layer 40 covers the second part 3*b* of the second facet surface 36*a*. The refractive index of the light propagation layer 40 is lower than the refractive index of the columnar part 30. Specifically, the refractive index of the light propagation layer 40 is lower than the refractive index of the first semiconductor layer 32, the refractive index of the light-emitting layer 34, and the refractive index of the second semiconductor layer 36. The light propagation layer 40 is, for example, an AlGaN layer or the like. The light generated in the light-emitting layer 34 can pass through the light propagation layer 40 and propagate in a direction (planar direction) orthogonal to the layer-stacking direction.

In the laminated structure 20, the average refractive index in the planar direction at the part where the second part 3*b* of the second facet surface 36*a* is provided is lower than the average refractive index in the planar direction at the part where the second facet surface 36*a* is not provided (the part where the lateral surface 30*a* is provided).

Here, the "average refractive index in the planar direction" is the average refractive index in a direction orthogonal to the layer-stacking direction, at a predetermined position in the layer-stacking direction. For example, an average refractive index $n_{AVE}$ in the planar direction at the where the columnar part 30 is provided, in the laminated structure 20, is expressed by the following formula (4).

Math. 1

$$n_{AVE}=\sqrt{\varepsilon_1\cdot\phi+\varepsilon_2(1-\phi)} \quad (4)$$

In the formula (4), $\varepsilon_1$ is the dielectric constant of the columnar part 30 (that is, the dielectric constant of the first semiconductor layer 32, the light-emitting layer 34, and the second semiconductor layer 36). $\varepsilon_2$ is the dielectric constant of the light propagation layer 40. $\phi$ is the ratio $S_1/S$ of the cross-sectional area $S_1$ of the columnar part 30 in the planar direction to the cross-sectional area S of the laminated structure 20 in the planar direction, at a predetermined position in the layer-stacking direction.

In the light-emitting device 100, the p-type second semiconductor layer 36, the light-emitting layer 34 not doped with impurities, and the n-type first semiconductor layer 32 form a PIN diode. Each of the first semiconductor layer 32 and the second semiconductor layer 36 is a layer having a larger band gap than the light-emitting layer 34. In the light-emitting device 100, when a forward bias voltage of the PIN diode is applied (a current is injected) between the first electrode 50 and the second electrode 52, electron-hole recombination occurs in the light-emitting layer 34. This recombination causes light emission. The light generated in the light-emitting layer 34 is made to propagate through the light propagation layer 40 in the planar direction by the semiconductor layers 32, 36, then forms a standing wave by the photonic crystal effect of the plurality of columnar parts 30, receives a gain in the light-emitting layer 34, and performs laser oscillation. Then, the light-emitting device 100 emits positive first-order diffracted light and negative first-order diffracted light as laser beams into the layer-stacking direction (toward the second electrode 52 and toward the substrate 10).

Although not illustrated in the drawings, a reflection layer may be provided between the substrate 10 and the buffer layer 22 or under the substrate 10. The reflection layer is, for example, a DBR (distributed Bragg reflector) layer. The reflection layer can reflect the light generated in the light-emitting layer 34, and the light-emitting device 100 can emit the light from the side of the second electrode 52 only.

The first electrode 50 is provided over the buffer layer 22. The buffer layer 22 may be in ohmic contact with the first electrode 50. The first electrode 50 is electrically coupled to the first semiconductor layer 32. In the illustrated example, the first electrode 50 is electrically coupled to the first semiconductor layer 32 via the buffer layer 22. The first electrode 50 is one electrode for injecting a current into the light-emitting layer 34. As the first electrode 50, for example, an electrode made up of a Ti layer, an Al layer, and an Au layer stacked in this order from the side of the buffer layer 22, or the like, is used. When the substrate 10 is electrically conductive, the first electrode 50 may be provided under the substrate 10, though not illustrated in the drawings.

The second electrode 52 is provided on the side opposite to the side of the substrate 10, of the laminated structure 20. In the illustrated example, the second electrode 52 is provided over the second semiconductor layer 36 and over the light propagation layer 40. The second electrode 52 covers the first part *3a* of the second facet surface 36*a*. The second semiconductor layer 36 may be in ohmic contact with the second electrode 52. The second electrode 52 is electrically coupled to the second semiconductor layer 36. The second electrode 52 is the other electrode for injecting a current into the light-emitting layer 34. As the second electrode 52, for example, ITO (indium tin oxide) is used.

The light-emitting device 100 has, for example, the following characteristics.

In the light-emitting device 100, the upper end part 35 of the light-emitting layer 34 has the first facet surface 34*a*, and the upper end part 38 of the second semiconductor layer 36 has the second facet surface 36*a*. The relation of $\theta2\leq\theta1$ is satisfied, where $\theta1$ is the taper angle of the first facet surface 34*a* and 02 is the taper angle of the second facet surface 36*a*. $\theta1$ is 70° or smaller and $\theta2$ is 30° or greater. Therefore, in the light-emitting device 100, the average refractive index in the planar direction at the part where the second facet surface 36*a* is provided (specifically, the average refractive index in the planar direction at the part where the second part *3b* of the second facet surface 36*a* is provided) can be made lower than when 02 is 0° (when the upper surface of the second semiconductor layer is not tilted in relation to a surface orthogonal to the layer-stacking direction). Thus, in the light-emitting device 100, the difference between the average refractive index in the planar direction at the part where the second facet surface 36*a* is provided and the average refractive index in the planar direction at the part where the light-emitting layer 34 is provided can be increased. Therefore, in the light-emitting device 100, the light generated in the light-emitting layer 34 can be restrained from leaking out toward the second electrode 52 and the absorption of the light by the second electrode 52 can be reduced.

In the light-emitting device 100, the second semiconductor layer 36 may contain indium gallium nitride, and the relations of $0<x<1$ and $x<y$ may be satisfied, where the composition of indium gallium nitride of the second semiconductor layer 36 is $In_xGa_{1-x}N$ and the composition of indium gallium nitride of the light-emitting layer 34 is $In_yGa_{1-y}N$. Therefore, in the light-emitting device 100, the difference in lattice constant between the light-emitting layer 34 and the second semiconductor layer 36 can be reduced. Thus, in the light-emitting device 100, the strain generated in the light-emitting layer 34 due to the difference in lattice constant between the light-emitting layer 34 and the second semiconductor layer 36 can be alleviated and crystal defects generated by the strain can be reduced. Therefore, in the light-emitting device 100, a non-light-emitting recombination site (a part that does not emit light even when electron-hole recombination occurs, in the light-emitting layer 34) is reduced and carrier leakage from the light-emitting layer 34 (leakage of carriers from the light-emitting layer 34) is avoided. Thus, a high light emission efficiency can be provided. Also, in the light-emitting device 100, since the strain in the light-emitting layer 34 is alleviated, the piezoelectric effect is reduced and the probability of light-emitting recombination (probability of electron-hole recombination in the light-emitting layer 34) is improved. Thus, a high light emission efficiency can be provided.

Also, in the light-emitting device 100, since the In composition ratio x of the second semiconductor layer 36 is lower than the In composition ratio y of the light-emitting layer 34, the first semiconductor layer 32 and the second semiconductor layer 36 can confine the light (light generated in the light-emitting layer 34) in the light-emitting layer 34.

In the light-emitting device 100, the relation of $x<0.5$ may be satisfied. Therefore, in the light-emitting device 100, the lattice constant of the second semiconductor layer 36 can be made smaller than 3.36 angstroms and the difference in lattice constant between the light-emitting layer 34 and the second semiconductor layer 36 can be reduced. The lattice constant of $In_{0.5}Ga_{0.5}N$ is 3.36 angstroms. The lattice constant of $In_{0.3}Ga_{0.7}N$ is 3.3 angstroms. The lattice constant of GaN is 3.18 angstroms.

In the light-emitting device 100, the In composition ratio x at the lower end part 37 of the second semiconductor layer 36 may be higher than the In composition ratio x at the upper end part 38 of the second semiconductor layer 36. Therefore, in the light-emitting device 100, as the In composition ratio x of the second semiconductor layer 36 is increased at the lower end part 37, which tends to influence the strain in the light-emitting layer 34, the strain generated in the light-emitting layer 34 can be alleviated.

In the light-emitting device 100, the In composition ratio x at the lower end part 37 may be, for example, 0.01 or lower. Therefore, in the light-emitting device 100, the difference in lattice constant between the light-emitting layer 34 and the second semiconductor layer 36 can be reduced.

Figure 3:
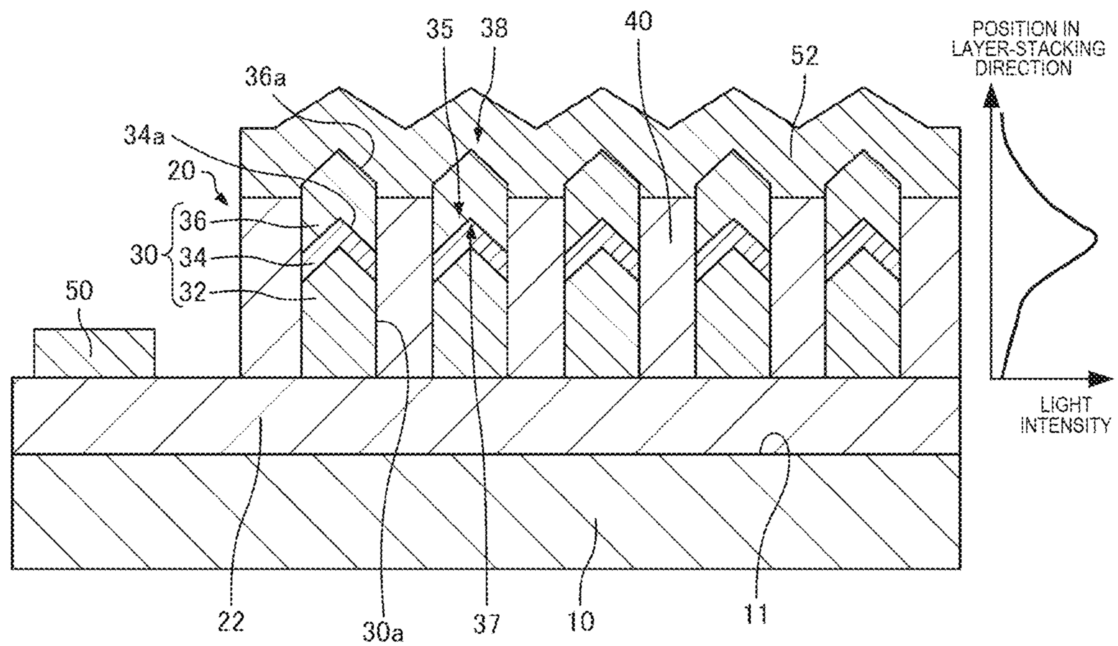
FIG. 3 is a cross-sectional view schematically showing a light-emitting device according to a reference example.

In the light-emitting device 100, the second facet surface 36*a* has the first part 3*a* covered with the second electrode 52, and the second part 3*b* not covered with the second electrode 52. Therefore, in the light-emitting device 100, for example, compared with the case where the second electrode 52 covers the entirety of the second facet surface 36*a* as shown in FIG. 3, the light generated in the light-emitting layer 34 can be restrained from leaking out toward the second electrode 52 and the absorption of the light by the second electrode 52 can be reduced. Also, in the light-emitting device 100, for example, compared with the example shown in FIG. 3, the peak of light intensity can be restrained from shifting toward the second electrode 52 due to the influence of the second electrode 52.

2. Method for Manufacturing Light-Emitting Device

Figure 4:
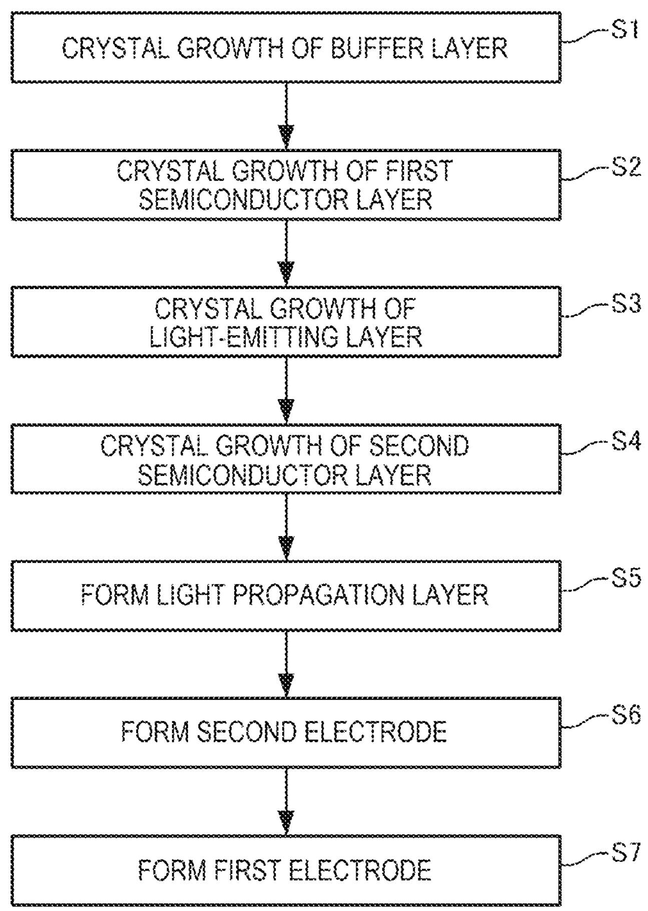
FIG. 4 is a flowchart for explaining a method for manufacturing the light-emitting device according to the embodiment.
Figure 5:
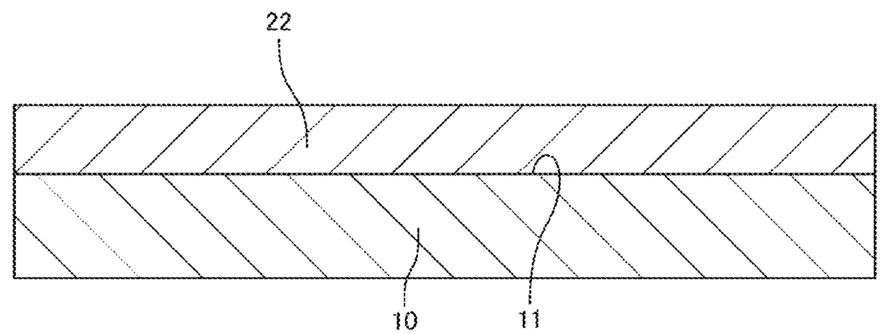
FIG. 5 is a cross-sectional view schematically showing a step of manufacturing the light-emitting device according to the embodiment.
Figure 6:
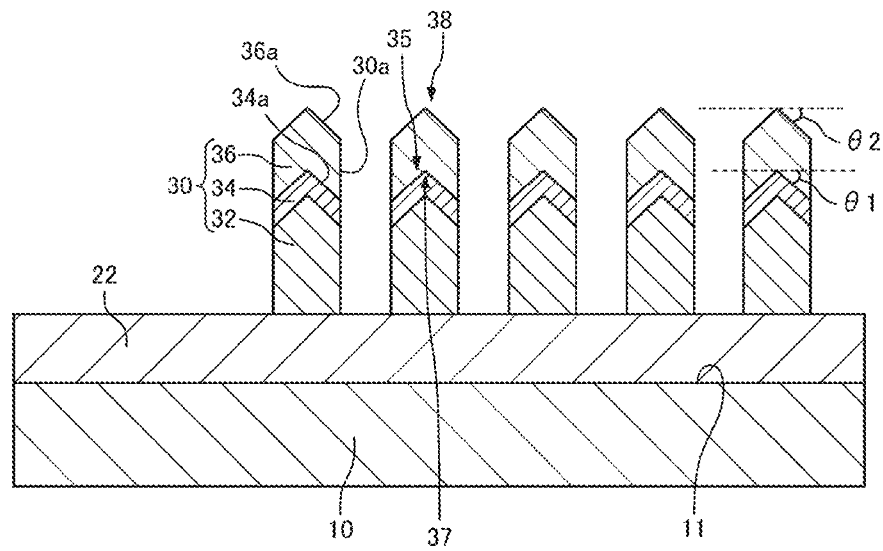
FIG. 6 is a cross-sectional view schematically showing a step of manufacturing the light-emitting device according to the embodiment.

Next, a method for manufacturing the light-emitting device 100 according to this embodiment will be described with reference to the drawings. FIG. 4 is a flowchart for explaining the method for manufacturing the light-emitting device 100 according to this embodiment. FIGS. 5 and 6 are cross-sectional views schematically showing steps of manufacturing the light-emitting device 100 according to this embodiment.

As shown in FIG. 5, gallium and nitrogen are supplied, thus causing crystal growth of the buffer layer 22 over the substrate 10 (step S1). In this step, irradiation with a Ga (gallium) molecular beam is performed to supply Ga. That is, the crystal growth of the buffer layer 22 is performed by the molecular beam epitaxy (MBE) method. In this step, nitrogen may be supplied as nitrogen molecules or may be supplied as nitrogen radicals. The method for supplying nitrogen is not particularly limited. This description of the supply of nitrogen also applies to the following steps (steps S2 to S4).

Next, a mask layer (not illustrated) of a predetermined shape is formed over the buffer layer 22. The mask layer is, for example, a titanium layer, titanium oxide layer, silicon oxide layer or the like.

As shown in FIG. 6, using the mask layer as a mask, gallium and nitrogen are supplied, thus causing crystal growth of the first semiconductor layer 32 at the substrate 10 (over the substrate 10) via the buffer layer 22 (step S2). In this step, irradiation with a Ga molecular beam is performed to supply Ga. That is, the crystal growth of the first semiconductor layer 32 is performed by the MBE method.

Next, indium, gallium, and nitrogen are supplied, thus causing crystal growth of the light-emitting layer 34 at the first semiconductor layer 32 (over the first semiconductor layer 32) (step S3). In this step, irradiation with an In (indium) molecular beam is performed to supply In, and irradiation with a Ga molecular beam is performed to supply Ga. That is, the crystal growth of the light-emitting layer 34 is performed by the MBE method. In this step, the amount of irradiation with In is, for example, greater than 0 Pa and equal to or smaller than $1\times10^{-3}$ Pa. The formation temperature of the light-emitting layer 34 (substrate temperature) is, for example, 500° C. or higher and 700° C. or lower. The amount of irradiation with In is measured by the pressure (Pa) of a measuring instrument (flux monitor).

Next, indium, gallium, and nitrogen are supplied, thus causing crystal growth of the second semiconductor layer 36 at the light-emitting layer 34 (over the light-emitting layer 34) (step S4). In this step, irradiation with an In molecular beam is performed to supply In, and irradiation with a Ga molecular beam is performed to supply Ga. That is, the crystal growth of the second semiconductor layer 36 is performed by the MBE method. In this step, the amount of irradiation with In is, for example, $1\times10^{-5}$ Pa or more and $2.5\times10^{-4}$ Pa or less, and preferably $2.5\times10^{-4}$ Pa. The formation temperature of the second semiconductor layer 36 is higher than the formation temperature of the light-emitting layer 34. The formation temperature of the second semiconductor layer 36 is, for example, 600° C. or higher and 900° C. or lower. As the second semiconductor layer 36 is deposited with the irradiation with In, the upper end part 38 of the second semiconductor layer 36 has the second facet surface 36*a*, and the taper angle θ2 of the second facet surface 36*a* can be made equal to or smaller than the taper angle θ1 of the first facet surface 34*a*.

The steps up to this point can form the plurality of columnar parts 30 at the substrate 10 (over the substrate 10).

As shown in FIG. 1, the light propagation layer 40 is formed between the neighboring columnar parts 30 (step S5). The light propagation layer 40 is formed, for example, by MOCVD (metal organic chemical vapor deposition) or the like. The light propagation layer 40 is formed in such a way that a part of the second facet surface 36*a* is exposed. The steps up to this point can form the laminated structure 20.

Next, the second electrode 52 is formed over the columnar part 30 and over the light propagation layer 40 (step S6). The second electrode 52 is formed, for example, by sputtering or vacuum deposition.

Next, the first electrode 50 is formed over the buffer layer 22 (step S7). The first electrode 50 is formed, for example, by sputtering or vacuum deposition. The order of the step of forming the first electrode 50 and the step of forming second electrode 52 is not particularly limited.

The foregoing steps can manufacture the light-emitting device 100.

The method for manufacturing the light-emitting device 100 includes the step of supplying indium, gallium, and nitrogen and causing crystal growth of the p-type second semiconductor layer at the light-emitting layer (step S4), and the formation temperature of the second semiconductor layer 36 is higher than the formation temperature of the light-emitting layer 34. Therefore, in the method for manufacturing the light-emitting device 100, as the In atom is adsorbed onto the Ga atom, the migration length (moving distance) of the Ga atom increases and this makes it easier to take over the underlying crystal structure. Therefore, the second semiconductor layer 36 can grow, taking over the first facet surface 34*a* of the light-emitting layer 34. Therefore, the taper angle θ2 of the second facet surface 36*a* can be made equal to or smaller than the taper angle θ1 of the first facet surface 34*a*. Thus, the method for manufacturing the light-emitting device 100 can manufacture the light-emitting device 100 in which the absorption of light by the second electrode 52 can be reduced.

Also, in the method for manufacturing the light-emitting device 100, as the In atom is adsorbed onto the GaN surface, the surface migration of the Ga atom is facilitated and dislocated growth is restrained (surfactant effect (interface effect due to addition of impurity)). Therefore, the method for manufacturing the light-emitting device 100 can improve the crystal quality of the second semiconductor layer 36.

In the method for manufacturing the light-emitting device 100, in the step of causing crystal growth of the second semiconductor layer 36 (step S4), the amount of irradiation with indium is $1\times10^{-5}$ Pa or more and $2.5\times10^{-4}$ Pa or less. Therefore, the method for manufacturing the light-emitting device 100 can manufacture the light-emitting device 100 having a high light emission efficiency (for details, see "Experiment Example", described later).

In the step of performing irradiation with In and Ga, supplying nitrogen, and causing crystal growth of the p-type second semiconductor layer at the light-emitting layer (step S4), a p-type InGaN layer may be formed by taking in In, or a p-type GaN layer may be formed without taking in In.

In the above description, an example where the crystal growth of the buffer layer 22, the first semiconductor layer 32, the light-emitting layer 34, and the second semiconductor layer 36 is performed by MBE, is described. However, this is not limiting. The crystal growth of the buffer layer 22, the first semiconductor layer 32, the light-emitting layer 34, and the second semiconductor layer 36 may be performed by the MOCVD (metal organic chemical vapor deposition) method.

4. Projector

Figure 7:
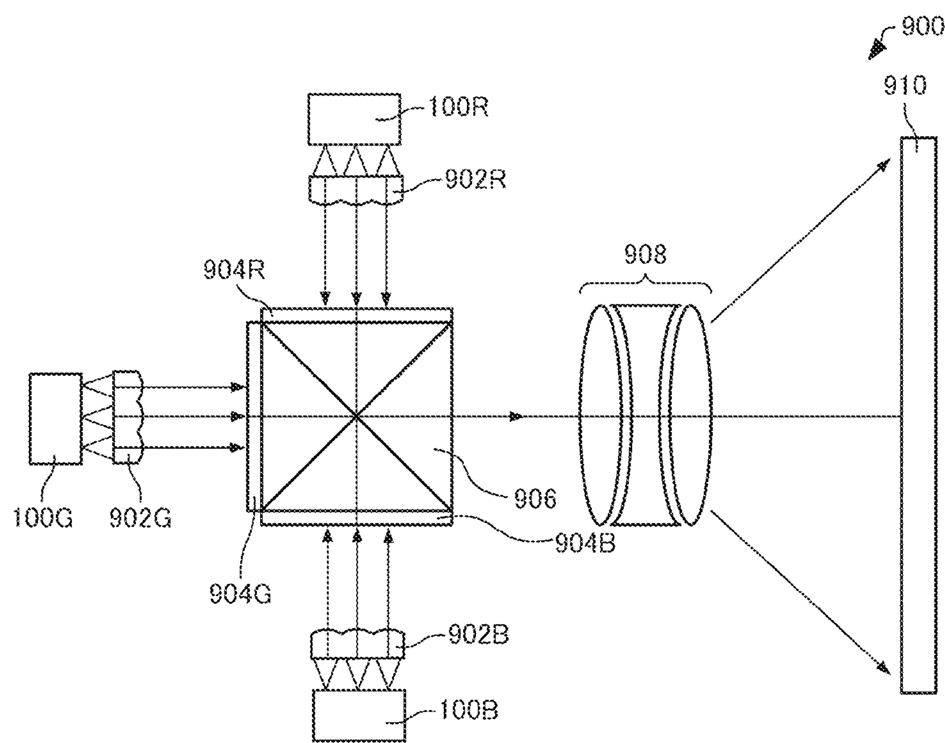
FIG. 7 is a view schematically showing a projector according to the embodiment.

Next, a projector according to this embodiment will be described with reference to the drawings. FIG. 7 is a view schematically showing a projector 900 according to this embodiment.

The projector according to the disclosure has the light-emitting device according to the disclosure. Hereinafter, the projector 900 having the light-emitting device 100 as the light-emitting device according to the disclosure will be described.

The projector 900 has a casing (not illustrated), and a red light source 100R, a green light source 100G, and a blue light source 100B respectively red light, green light and blue light provided inside the casing. Each of the red light source 100R, the green light source 100G, and the blue light source 100B is made up of, for example, a plurality of light-emitting devices 100 arranged in the form of an array in a direction orthogonal to the layer-stacking direction, with the substrate 10 shared as a common substrate among the plurality of light-emitting devices 100. The number of the light-emitting devices 100 forming each of the light sources 100R, 100G, 100B is not particularly limited. In FIG. 7, for the sake of convenience, the casing forming the projector 900 is omitted and the light sources 100R, 100G, 100B are simplified.

The projector 900 also has lens arrays 902R, 902G, 902B, transmission-type liquid crystal light valves (light modulation devices) 904R, 904G, 904B, and a projection lens (projection device) 908, provided inside the casing.

The light emitted from the light sources 100R, 100G, 100B becomes incident on the respective lens arrays 902R, 902G, 902B. The light emitted from the light sources 100R, 100G, 100B is condensed by the lens arrays 902R, 902G, 902B, and for example, can be superimposed (partly superimposed). Thus, the liquid crystal light valves 904R, 904G, 904B can be irradiated with high uniformity.

The light condensed by the respective lens arrays 902R, 902G, 902B becomes incident on the respective liquid crystal light valves 904R, 904G, 904B. The respective liquid crystal light valves 904R, 904G, 904B modulate the incident light respectively according to image information. Then, the projection lens 908 enlarges and projects an image formed by the liquid crystal light valves 904R, 904G, 904B onto a screen (display surface) 910.

The projector 900 can also have a cross dichroic prism (light combining unit) 906 combining together the light emitted from the liquid crystal light valves 904R, 904G, 904B and guiding the light to the projection lens 908.

The three color lights modulated by the respective liquid crystal light valves 904R, 904G, 904B become incident on the cross dichroic prism 906. This prism is formed by four right-angle prisms bonded together, and a dielectric multilayer film reflecting red light and a dielectric multilayer film reflecting blue light are arranged in the shape of a cross at the inner surfaces of the right-angle prisms. The three color lights are combined together by these dielectric multilayer films, thus forming light that represents a color image. The combined light is projected onto the screen 910 by the projection lens 908 as a projection system, and an enlarged image is thus displayed.

The light sources 100R, 100G, 100B may also control (modulate) the light-emitting devices 100 forming the light sources 100R, 100G, 100B as pixels of an image according to image information and thus directly form the image without using the liquid crystal light valves 904R, 904G, 904B. Then, the projection lens 908 may enlarge and project the images formed by the light sources 100R, 100G, 100B, onto the screen 910.

Also, while the transmission-type liquid crystal light valve is used as the light modulation device in the above example, a light valve other than liquid crystal may be used, or a reflection-type light valve may be used. Such a light valve may be, for example, a reflection-type liquid crystal light valve or digital micromirror device. Also, the configuration of the projection system is properly changed according to the type of the light valve used.

Also, the light sources 100R, 100G, 100B can be applied to alight source device of a scanning-type image display device (projector) having a scanning unit as an image forming device which scans the screen with the light from the light sources 100R, 100G, 100B and thus displays an image of a desired size on the display surface.

The application of the light-emitting device according to the disclosure is not limited to the foregoing embodiment. The light-emitting device according to the disclosure can also be used as the light source of outdoor and indoor illumination, display backlight, laser printer, scanner, vehicle-installed light, sensing equipment using light, and communication device or the like, other than projector.

5. Experiment Example

Hereinafter, an experiment example will be given and the disclosure will be described more specifically. However, the disclosure is not limited at all by the following experiment example.

5.1. Preparation of Sample 5.1.1. Example 1

In Example 1, gallium and nitrogen are supplied, thus causing crystal growth of an n-type buffer layer at a substrate (GaN substrate). Next, a Ti layer is formed over the buffer layer, and with the Ti layer as a mask, gallium and nitrogen are supplied, thus causing crystal growth of a first semiconductor layer over the buffer layer. Next, indium, gallium, and nitrogen are supplied, thus causing crystal growth of a light-emitting layer over the first semiconductor layer. Next, indium, gallium, and nitrogen are supplied, thus causing crystal growth of a second semiconductor layer over the light-emitting layer. Thus, a columnar part made up of the first semiconductor layer, the light-emitting layer, and the second semiconductor layer is formed. The crystal growth of the buffer layer, the first semiconductor layer, the light-emitting layer, and the second semiconductor layer is performed by the MBE method. That is, in the step of causing the crystal growth of the buffer layer, the first semiconductor layer, the light-emitting layer, and the second semiconductor layer, irradiation with a Ga molecular beam is performed to supply Ga, and irradiation with an In molecular beam is performed to supply In.

When causing the crystal growth of the light-emitting layer, irradiation with In is performed in an amount of irradiation of $2.5\times10^{-4}$ Pa, and the formation temperature of the light-emitting layer (substrate temperature) is 500° C. or higher and 700° C. or lower. Also, when causing the crystal growth of the second semiconductor layer, irradiation with In is performed in an amount of irradiation of $2.5\times10^{-4}$ Pa, and the formation temperature of the second semiconductor layer is 600° C. or higher and 900° C. or lower.

5.1.2. Example 2

In Example 2, a sample is prepared similarly to Example 1 except that the amount of irradiation with In is $1\times10^{-5}$ Pa when causing the crystal growth of the second semiconductor layer.

5.1.3. Comparative Example 1

In Comparative Example 1, a sample is prepared similarly to Example 1, except that irradiation with In is not performed when causing the crystal growth of the second semiconductor layer, and that crystal growth of a p-type second semiconductor layer is performed.

5.2. PL Measurement

Figure 8:
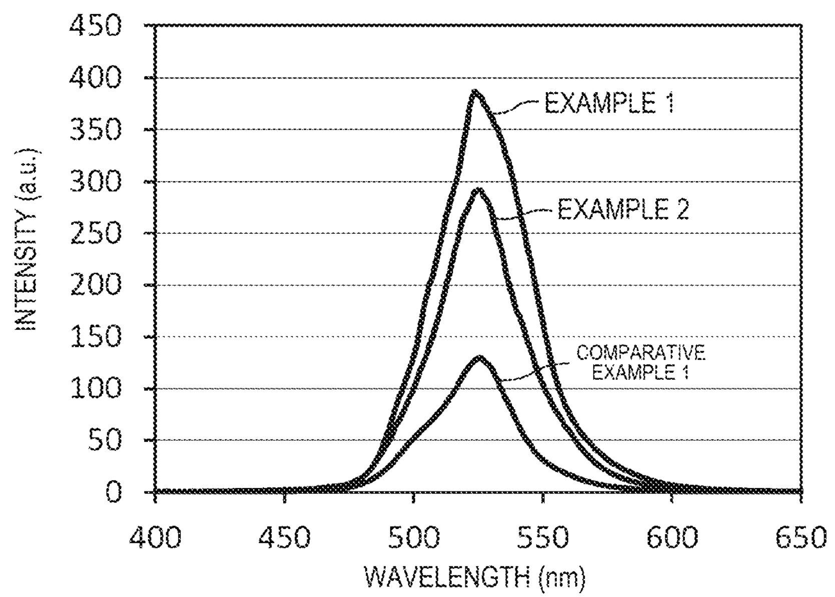
FIG. 8 is a graph showing results of PL measurement on Examples 1, 2 and Comparative Example 1.

Photoluminescence (PL) measurement is performed on Examples 1, 2 and Comparative Example 1. In PL measurement, irradiation is performed with light having a wavelength of 405 nm as excitation light. FIG. 8 is a graph showing the results of PL measurement on Examples 1, 2 and Comparative Example 1.

As shown in FIG. 8, Examples 1, 2 irradiated with In has a higher intensity than Comparative Example 1 not irradiated with In. This is considered to be due to the improvement in the quality of the crystal of the second semiconductor layer since the irradiation with In causes the In atom to be absorbed onto the GaN surface, thus facilitates the surface migration of the Ga atom, and restrains dislocated growth. Also, it is found that setting the amount of irradiation with In to $1\times10^{-5}$ Pa or more and $2.5\times10^{-4}$ Pa or less when causing the crystal growth of the second semiconductor layer can increase the light emission efficiency.

5.3. Evaluation of Crystal Defect by TEM Observation

Transmission electron microscope (TEM) observation is performed on Example 1 and Comparative Example 1, and dislocation (crystal defect) is evaluated. FIG. 9 is a TEM bright field image of a vicinity of the second semiconductor layer in Example 1. FIG. 10 is a TEM bright field image of a vicinity of the second semiconductor layer in Comparative Example 1. In FIGS. 9 and 10, a dislocation (crystal defect) is indicated by an arrow.

As shown in FIG. 9, no dislocation is confirmed in Example 1 irradiated with In. Meanwhile, as shown in FIG. 10, a dislocation is confirmed in Comparative Example 1 not irradiated with In. This is considered to be because the irradiation with In causes the In atom to be absorbed onto the GaN surface, thus facilitates the surface migration of the Ga atom, and restrains dislocated growth.

5.4. Evaluation of Taper Angle by TEM Observation

Figure 12:
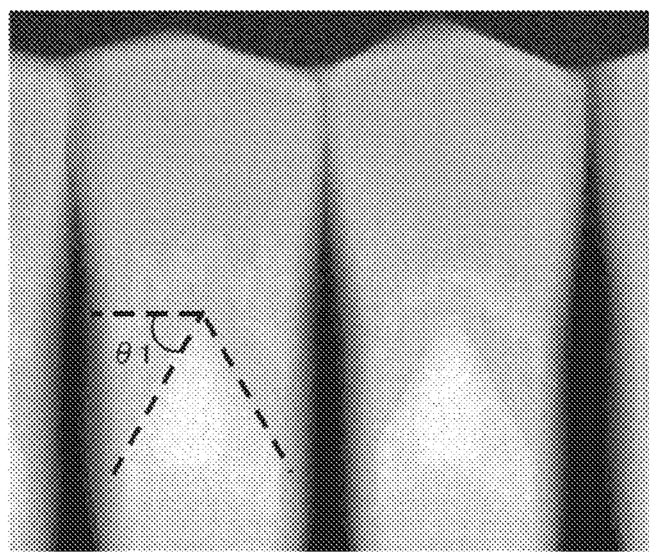
FIG. 12 is a TEM dark field image of a vicinity of the second semiconductor layer in Comparative Example 1.

TEM dark field observation is performed on Example 1 and Comparative Example 1, and the taper angle is evaluated. FIG. 11 is a TEM dark field image of a vicinity of the second semiconductor layer in Example 1. FIG. 12 is a TEM image of a vicinity of the second semiconductor layer in Comparative Example 1. FIG. 11 is an image at a different position from the TEM image shown in FIG. 9. Similarly, FIG. 12 is a dark field image at a different position from the TEM image shown in FIG. 10.

As shown in FIG. 11, the taper angle θ1 of the facet surface of the light-emitting layer and the taper angle θ2 of the facet surface of the second semiconductor layer are equal to each other. As the In atom is adsorbed onto the Ga atom due to the irradiation with In, the migration length (moving distance) of the Ga atom increases and this makes it easier to take over the underlying crystal structure. Meanwhile, as shown in FIG. 12, no facet surface is confirmed in the second semiconductor layer. By this evaluation, it is found that the crystal growth of the p-type second semiconductor layer irradiated with In can make the taper angle θ1 and the taper angle θ2 equal to each other.

According to the disclosure, apart of the configurations may be omitted or various embodiments and modification examples may be combined together, provided that the characteristics and effects described in this application are achieved.

The disclosure includes a configuration that is substantially the same as the configuration described in the embodiment (for example, a configuration having the same function, method, and effect, or a configuration having the same object and effect). The disclosure also includes a configuration in which a non-essential part of the configurations described in the embodiment is replaced. The disclosure also includes a configuration having the same advantageous effect as the configurations described in the embodiment, or a configuration that can achieve the same object. The disclosure also includes a configuration in which a known technique is added to the configuration described in the embodiment.

The invention claimed is:

1. A light-emitting device comprising:

a substrate;

a laminated structure provided at the substrate and having a plurality of columnar parts; and a light propagation layer disposed in spaces between the plurality of columnar parts to laterally surround the plurality of columnar parts, wherein each of the plurality of columnar parts includes:

a first semiconductor layer that is an n-type;

a second semiconductor layer that is a p-type;

a light-emitting layer provided between the first semiconductor layer and the second semiconductor layer; and an electrode provided on the second semiconductor layer, the electrode contacting a first part of a top surface of the second semiconductor layer, the electrode not contacting a second part of the top surface of the second semiconductor layer, the first part of the top surface of the second semiconductor layer is exposed from the light propagation layer, the second part of the top surface of the second semiconductor layer is covered by the light propagation layer, a top surface of a cross section of the substrate and a bottom surface of a cross section of the electrode are substantially parallel to each other except for parts of the bottom surface of the electrode where the first part of the top surface of the second semiconductor layer and the electrode contact each other, the first semiconductor layer is provided between the light-emitting layer and the substrate, a top surface of the light-emitting layer has a first facet surface, the top surface of the second semiconductor layer has a second facet surface, a relation of $\theta 2 \leq \theta 1$ is satisfied, where $\theta 1$ is a taper angle of the first facet surface, and $\theta 2$ is a taper angle of the second facet surface, and $\theta 1$ is 70° or smaller, $\theta 2$ is 30° or greater, and lateral surfaces of the first semiconductor layer, the second semiconductor layer, and the light emitting layer are substantially perpendicular to the top surface of the cross section of the substrate and aligned in a line.

2. The light-emitting device according to claim 1, wherein, the first semiconductor layer contains gallium nitride, the second semiconductor layer contains indium gallium nitride, the light-emitting layer contains indium gallium nitride, and relations of $0<x<1$ and $x<y$ are satisfied, where a composition of indium gallium nitride of the second semiconductor layer is $In_xGa_{1-x}N$ and a composition of indium gallium nitride of the light-emitting layer is $In_yGa_{1-y}M$.

3. The light-emitting device according to claim 2, wherein a relation of $x<0.5$ is satisfied.

4. The light-emitting device according to claim 2, wherein the second semiconductor layer has a first end part and a second end part outwardly opposite to each other, the first end part is located next to the light-emitting layer, and the second end part is located next to the electrode, and the x at the first end part of the second semiconductor layer is larger than the x at the second end part of the second semiconductor layer.

5. The light-emitting device according to claim 4, wherein, the x at the first end part of the second semiconductor layer is 0.01 or less.

6. A projector comprising:

a light-emitting device, the light-emitting device including:

a substrate;

a laminated structure provided at the substrate and having a plurality of columnar parts; and a light propagation layer disposed in spaces between the plurality of columnar parts to laterally surround the plurality of columnar parts; and an optical element receiving a light from the light-emitting device, wherein each of the plurality of columnar parts includes:

a first semiconductor layer that is an n-type;

a second semiconductor layer that is a p-type;

a light-emitting layer provided between the first semiconductor layer and the second semiconductor layer; and an electrode provided on the second semiconductor layer, the electrode contacting a first part of a top surface of the second semiconductor layer, the electrode not contacting a second part of the top surface of the second semiconductor layer, the first part of the top surface of the second semiconductor layer is exposed from the light propagation layer, the second part of the top surface of the second semiconductor layer is covered by the light propagation layer, a top surface of a cross section of the substrate and a bottom surface of a cross section of the electrode are substantially parallel to each other except for parts of the bottom surface of the electrode where the first part of the top surface of the second semiconductor layer and the electrode contact each other, the first semiconductor layer is provided between the light-emitting layer and the substrate, a top surface of the light-emitting layer has a first facet surface, the top surface of the second semiconductor layer has a second facet surface, a relation of $\theta 2 \leq \theta 1$ is satisfied, where $\theta 1$ is a taper angle of the first facet surface, and $\theta 2$ is a taper angle of the second facet surface, and $\theta 1$ is 70° or smaller, $\theta 2$ is 30° or greater, and lateral surfaces of the first semiconductor layer, the second semiconductor layer, and the light emitting layer are substantially perpendicular to the top surface of the cross section of the substrate and aligned in a line.

* * * * *